United States Patent
Miao et al.

(10) Patent No.: US 12,293,804 B2
(45) Date of Patent: May 6, 2025

(54) CONVOLUTION OPERATION ACCELERATOR AND CONVOLUTION OPERATION METHOD

(71) Applicant: HUAZHONG UNIVERSITY OF SCIENCE AND TECHNOLOGY, Hubei (CN)

(72) Inventors: Xiangshui Miao, Hubei (CN); Jiawei Fu, Hubei (CN); Yuhui He, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 0 days.

(21) Appl. No.: 18/266,610

(22) PCT Filed: Apr. 20, 2022

(86) PCT No.: PCT/CN2022/087794
§ 371 (c)(1),
(2) Date: Jun. 12, 2023

(87) PCT Pub. No.: WO2023/173530
PCT Pub. Date: Sep. 21, 2023

(65) Prior Publication Data
US 2025/0022490 A1  Jan. 16, 2025

(30) Foreign Application Priority Data
Mar. 18, 2022 (CN) .......................... 202210272801.8

(51) Int. Cl.
*G11C 5/02* (2006.01)
*G06N 3/0464* (2023.01)
(Continued)

(52) U.S. Cl.
CPC .............. *G11C 5/02* (2013.01); *G06N 3/0464* (2023.01); *G11C 5/063* (2013.01); *G06N 3/045* (2023.01); *G06N 3/063* (2013.01); *Y02D 10/00* (2018.01)

(58) Field of Classification Search
CPC .......... G11C 5/02; G11C 5/063; G06N 3/045; G06N 3/0464; G06N 3/063; Y02D 10/00
(Continued)

(56) References Cited

U.S. PATENT DOCUMENTS

2018/0307980 A1* 10/2018 Barik .................... G06F 9/3887
2019/0108437 A1   4/2019 Hsu et al.

FOREIGN PATENT DOCUMENTS

CN   106530210   3/2017
CN   106847335   6/2017
(Continued)

OTHER PUBLICATIONS

Chris Yakopcic et al., "Extremely Parallel Memristor Crossbar Architecture for Convolutional Neural Network Implementation", 2017 International Joint Conference on Neural Networks (IJCNN), Jul. 2017, pp. 1696-1703.
(Continued)

*Primary Examiner* — Ly D Pham
(74) *Attorney, Agent, or Firm* — JCIPRNET

(57) ABSTRACT

The disclosure provides a convolution operation accelerator and a convolution operation method and belongs to the field of microelectronic devices. Input data of each word line may be subjected to a multiply-accumulate operation together with two upper and lower layers of convolution kernel units, so that natural sliding of the convolution kernel units in a y direction in two-dimensional input is achieved. The oblique bit lines and multiple copies of a convolution kernel in each layer of a non-volatile memory array may enable a multi-
(Continued)

plication operation between one piece of input data and convolution kernel data at different positions in the same convolution kernel. In this way, the natural sliding of the convolution kernel units in an x direction in the two-dimensional input is achieved.

10 Claims, 8 Drawing Sheets

(51) Int. Cl.
*G11C 5/06* (2006.01)
*G06N 3/045* (2023.01)
*G06N 3/063* (2023.01)

(58) Field of Classification Search
USPC .......................................................... 365/51
See application file for complete search history.

(56) References Cited

FOREIGN PATENT DOCUMENTS

| | | |
|---|---|---|
| CN | 107368889 | 11/2017 |
| CN | 110826709 A | 2/2020 |
| CN | 110826709 B | 4/2021 |
| EP | 3396533 A2 * | 10/2018 ........... G06F 9/3001 |

OTHER PUBLICATIONS

Chris Yakopcic et al., "Memristor Crossbar Deep Network Implementation Based on a Convolutional Neural Network", 2016 International Joint Conference on Neural Networks (IJCNN), Nov. 2016, pp. 963-970.

Peng Lin et al., "Three-dimensional Memristor circuits as complex neural networks", Nature Electronics, Apr. 2020, pp. 225-232.

"International Search Report (Form PCT/ISA/210) of PCT/CN2022/087794," mailed on Oct. 26, 2022, pp. 1-5.

"Written Opinion of the International Searching Authority (Form PCT/ISA/237) of PCT/CN2022/087794," mailed on Oct. 26, 2022, pp. 1-4.

* cited by examiner

CONVOLUTION OPERATION ACCELERATOR AND CONVOLUTION OPERATION METHOD

CROSS-REFERENCE TO RELATED APPLICATION

This application is a 371 of international application of PCT application serial no. PCT/CN2022/087794, filed on Apr. 20, 2022, which claims the priority benefit of China application no. 202210272801.8, filed on Mar. 18, 2022. The entirety of each of the above mentioned patent applications is hereby incorporated by reference herein and made a part of this specification.

TECHNICAL FIELD

The disclosure belongs to the field of microelectronic devices, and in particular, relates to a convolution operation accelerator and a convolution operation method.

DESCRIPTION OF RELATED ART

A convolution neural network (CNN) is a form of feed-forward neural network, and it includes a convolutional layer, a pooling layer, and a fully-connected layer most of the times. The convolution neural network is used to process image information most of the time. After an image is input to the convolutional layer, the local features are extracted through the convolution operation, and then the size of the model is compressed through the pooling layer to reduce the amount of computing, and finally the features are integrated through the fully-connected layer to obtain the output. The convolution neural network exhibits the characteristics of local connection and weight sharing, and its parameter amount is much smaller than that of a multi-layered perceptron model. Further, the convolution neural network has achieved favorable results in the field of image recognition.

Although the convolution neural network has fewer parameters, during the forward propagation process, the convolution operation in the convolutional layer produces most of the computing amounts in the network. The convolution operation process is as follows: the convolution kernel slides on the input data with a specific step length and performs a multiply-accumulate operation between the convolution kernel and the corresponding input data every time it slides. This process is slow and takes up a lot of space in conventional computing units (e.g., CPU and GPU).

Further, for some computing structures based on new types of memory, such as planar crossbar arrays, it is necessary to stretch two-dimensional input information into one dimension and then input it to the array. Besides, if the array units are to be fully used, rolling input is required to be adopted, and the parallelism of the input is excessively low, and the time cost is considerable. If multiple convolution kernels are copied in the crossbar array for large-scale parallel computing, it will take up a lot of area, and most of the units will not be used, which will increase the impact of leakage current on the computing results.

Therefore, an architecture capable of highly parallel computing and fully utilizing computing resources is needed to accelerate convolution operations.

SUMMARY

In response to the above defects or the needs for improvement in the related art, the disclosure provides a convolution operation accelerator and a convolution operation method configured to solve the problems of stretching two-dimensional input into one-dimensional, low parallelism, and low utilization of array units when a planar memory array performs convolution calculation.

To achieve the above, the disclosure provides a convolution operation accelerator including a three-dimensional non-volatile memory array and a control module.

The three-dimensional non-volatile memory array includes P word line electrode layers. A bit line electrode layer is placed between any two adjacent word line electrode layers. A non-volatile memory cell array is placed between any adjacent word line electrode layer and bit line electrode layer, and the non-volatile memory cell array is vertically connected to both the word line electrode layer and the bit line electrode layer.

The word line electrode layers include a plurality of word line electrodes arranged in parallel, and the word line electrodes in the P word line electrode layers together form a word line electrode array.

Each column of non-volatile memory cells in the non-volatile memory cell array is connected onto a same word line in the word line electrode layer connected to the non-volatile memory cell array. The non-volatile memory cells on each oblique line in the non-volatile memory cell array are connected onto a same bit line in a bit line electrode array connected to the non-volatile memory cell array. Herein, the oblique line is an oblique line in the non-volatile memory cell array parallel to a corresponding diagonal line in the non-volatile memory cell array.

A size of two-dimensional input data is denoted as M×N.

When a size of a convolution kernel being subjected to a convolution operation with the two-dimensional input data is 2k×c, the control module is configured to split the convolution kernel into k convolution kernel units with a size of 2×c by row, where k is a positive integer, select and arrange k different sub-array units with a size of (M−2(k−1))×N in the word line electrode array to correspond to the k convolution kernel units with the size of 2×c one to one according to a splitting sequence of the convolution kernel, store each convolution kernel unit and N−c copies thereof in the two layers of the non-volatile memory cell arrays between all adjacent two word line electrode layers in the corresponding sub-array unit, and apply data from a 2i−1th row to a M−2(k−i)th row of the two-dimensional input data to the corresponding word line electrode in an i th sub-array unit in the form of voltage according to corresponding coordinate information, where i=1, 2, L, . . . , k.

When the size of the convolution kernel is (2k+1)×c, the control module is configured to split the convolution kernel into k convolution kernel units with a size of 2×c and one convolution kernel unit with a size of 1×c by row, select k sub-array units with a size of (M−2(k−1)−1)×N and one sub-array unit with a size of (M−2k)×N in the word line electrode array, arrange the k sub-array units with the size of (M−2(k−1)−1)×N to correspond to the k convolution kernel units with the size of 2×c one to one according to the splitting sequence of the convolution kernel, store each convolution kernel unit with the size of 2×c and N−c copies thereof in the two layers of the non-volatile memory cell arrays between all adjacent two word line electrode layers in the corresponding sub-array unit, for each word line electrode layer in the sub-array unit with the size of (M−2k)×N, store the convolution kernel unit with the size of 1×c and the N−c copies of the convolution kernel unit with the size of 1×c in one of the non-volatile memory cell arrays connected to it and set all the non-volatile memory cells in the non-volatile memory cell array not storing the convolution kernel unit to a high-impedance state, apply data from the 2i−1th row to a M−2(k−i)−1th row on the two-dimensional input data to the corresponding word line electrode in the ith sub-array unit with the size of (M−2(k−1)−1)×N in the form of voltage according to the corresponding coordinate information, where i=1, 2, L, . . . , k, and apply data from a 2k+1th row to a Mth row on the two-dimensional input data to the corresponding word line electrode in the sub-array unit with the size of (M−2k)×N in the form of voltage according to the corresponding coordinate information.

The three-dimensional non-volatile memory array is configured to achieve in parallel a dot product operation between the convolution kernel units and different parts of the two-dimensional input data based on the non-volatile memory cell array and is configured to output in parallel a sum of dot product operation results of the convolution kernel units and the corresponding parts of the two-dimensional input data via the corresponding bit line electrode layer, so as to achieve the convolution operation between the convolution kernel and the two-dimensional input data.

After being sequentially stored on the corresponding oblique line of the corresponding non-volatile memory cell array, each row of convolution kernel data of the convolution kernel units moves horizontally in a sliding direction of the convolution kernel onto the adjacent N−c oblique lines, and the row of convolution kernel data is stored again. Each layer of the non-volatile memory cell array stores the convolution kernel data of the corresponding row in the convolution kernel unit, and N−c copies of the convolution kernel data are implemented.

Further preferably, when the size of the convolution kernel is 2k×c, based on the two layers of the non-volatile memory cell arrays between all adjacent two word line electrode layers in the sub-array unit with the size of (M−2(k−1))×N and after achieving the dot product operation between the convolution kernel units with the size of 2×c and the different parts of the two-dimensional input data in parallel, the three-dimensional non-volatile memory array is configured to output in parallel the sum of the dot product operation results of the convolution kernel units with the size of 2×c and the corresponding parts of the two-dimensional input data through the corresponding bit line electrode layer. The control module is further configured to summarize outputs of bit lines at a same relative position in each selected sub-array unit and obtain a convolution operation result of the convolution kernel and the two-dimensional input data.

When the size of the convolution kernel is (2k+1)×c, based on the two layers of the non-volatile memory cell arrays between all adjacent two word line electrode layers in the sub-array unit with the size of (M−2(k−1)−1×N and after achieving the dot product operation between the convolution kernel units with the size of 2×c and different parts of the two-dimensional input data in parallel, the three-dimensional non-volatile memory array is configured to output in parallel the sum of the dot product operation results of the convolution kernel units with the size of 2×c and the corresponding parts of the two-dimensional input data through the corresponding bit line electrode layer, and based on the non-volatile memory cell array in the sub-array unit with the size of (M−2k)×N and after achieving in parallel the dot product operation between the convolution kernel unit with the size of 1×c and the different parts of the two-dimensional input data, is configured to output in parallel the sum of the dot product operation results of the convolution kernel unit with the size of 1×c and the corresponding parts of the two-dimensional input data through the corresponding bit line electrode layer. The control module is further configured to correspondingly summarize the outputs of the bit lines in each selected sub-array unit and obtain the convolution operation result of the convolution kernel and the two-dimensional input data.

Further preferably, the three-dimensional non-volatile memory array is a multi-layered stacked structure and is formed by sequentially stacking the word line electrode layers, the non-volatile memory cell arrays, and the bit line electrode layers. The word line electrode layers and the word line electrode layers and the bit line electrode layers are parallel to each other.

Further preferably, the control module includes an input end signal generating device, an output end signal generating device, and an output signal readout device.

The input end signal generating device is matched with the output end signal generating device. A voltage is applied to the word line electrodes and the bit line electrodes corresponding to the sub-array units. The corresponding non-volatile memory cells are selected, and a conductance value of each selected non-volatile memory cell is changed to store the corresponding convolution kernel data.

The input end signal generating device is further configured to apply the two-dimensional input data to the corresponding word line electrodes in the sub-array units in the form of voltage according to the coordinate information of the two-dimensional input data.

The output signal readout device is configured to detect output currents on the bit line electrodes and convert the output currents into a voltage signal as the convolution operation result.

Further preferably, a read voltage of the input end signal generating device is less than or equal to a current set voltage value on the non-volatile memory cell, so as to ensure that the conductance value of the non-volatile memory cell is not changed during the convolution operation.

Further preferably, the convolution operation accelerator is configured to achieve the convolution operation in a convolution neural network.

Further preferably, during a training process of the convolutional neural network, the control module is further configured to adjust the conductance value of each non-volatile memory cell by applying a write voltage on the corresponding word line electrode and bit line electrode to update a parameter of the convolutional neural network and re-uses the convolution operation result of a previous round of the convolution operation accelerator as input of a next round of convolution operation of the convolution operation accelerator.

Further preferably, when the conductance value of the non-volatile memory cell is required to be increased, an absolute value of a write voltage difference value applied to the corresponding word line electrode and the bit line electrode is the corresponding set voltage value.

When the conductance value of the non-volatile storage unit is required to be decreased, the absolute value of the write voltage difference value applied to the corresponding word line electrode and the bit line electrode is a corresponding reset voltage value.

In the second aspect, the disclosure provides a convolution operation method based on the abovementioned convolution operation accelerator, and the method includes the following steps.

In step S1, when a size of a convolution kernel being subjected to a convolution operation with two-dimensional input data is 2k×c, the convolution kernel is split into k convolution kernel units with a size of 2×c by row, where k is a positive integer. k different sub-array units with a size of (M−2(k−1))×N are selected and arranged in a word line electrode array to correspond to the k convolution kernel units with the size of 2×c one to one according to the splitting sequence of the convolution kernel. Each convolution kernel unit and N−c copies thereof are stored in two layers of non-volatile memory cell arrays between all adjacent two word line electrode layers in the corresponding sub-array unit. Data from a 2i−1th row to a M−2(k−i)th row of the two-dimensional input data is applied to a corresponding word line electrode in an ith sub-array unit in the form of voltage according to corresponding coordinate information, where i=1, 2, L, . . . , k.

When the size of the convolution kernel is (2k+1)×c, the convolution kernel is split into k convolution kernel units with a size of 2×c and one convolution kernel unit of a size of 1×c by row. k sub-array units with the size of (M−2(k−1)−1)×N and one sub-array unit with the size of (M−2k)×N are selected in the word line electrode array. The k sub-array units with the size of (M−2(k−1)−1)×N are arranged to correspond to the k convolution kernel units with the size of 2×c one to one according to the splitting sequence of the convolution kernel. Each convolution kernel unit with the size of 2×c and N−c copies thereof are stored in the two layers of the non-volatile memory cell arrays between all adjacent two word line electrode layers in the corresponding sub-array unit. For each word line electrode layer in the sub-array unit with the size of (M−2k)×N, the convolution kernel unit with the size of 1×c and the N−c copies of the convolution kernel unit with the size of 1×c in one of the non-volatile memory cell arrays connected to it are stored, and all the non-volatile memory cells in the non-volatile memory cell array not storing the convolution kernel unit are set to a high-impedance state. Data from the 2i−1th row to the M−2(k−i)−1th row on the two-dimensional input data is applied to the corresponding word line electrode in the ith sub-array unit with the size of (M−2(k−1)−1)×N in the form of voltage according to corresponding coordinate information, where i=1, 2, L, . . . , k. Data from the 2k+1th row to the Mth row on the two-dimensional input data is applied to the corresponding word line electrode in the sub-array unit with the size of (M−2k)×N in the form of voltage according to the corresponding coordinate information.

In step S2, a dot product operation between the convolution kernel units and the different parts of the two-dimensional input data is achieved in parallel based on the non-volatile storage unit array, and a sum of dot product operation results of the convolution kernel units and the corresponding parts of the two-dimensional input data are outputted in parallel via the corresponding bit line electrode layer, so as to achieve the convolution operation between the convolution kernel and the two-dimensional input data.

Herein, a size of two-dimensional input data is denoted as M×N. After being sequentially stored on a corresponding oblique line of the corresponding non-volatile memory cell array, each row of convolution kernel data of the convolution kernel units moves horizontally in a sliding direction of the convolution kernel onto the adjacent N−c oblique lines, and the row of convolution kernel data is stored again. Each layer of the non-volatile memory cell array stores the convolution kernel data of the corresponding row in the convolution kernel unit, and N−c copies of the convolution kernel data are implemented.

Further preferably, when the size of the convolution kernel is 2k×c, step S2 includes the following. Based on the two layers of the non-volatile memory cell arrays between all adjacent two word line electrode layers in the sub-array unit with the size of (M−2(k−1))×N and after achieving in parallel the dot product operation between the convolution kernel units with the size of 2×c and the different parts of the two-dimensional input data, the sum of the dot product operation results of the convolution kernel units with the size of 2×c and the corresponding parts of the two-dimensional input data is output in parallel through the corresponding bit line electrode layer. Outputs of bit lines at a same relative position in each selected sub-array unit are summarized, and a convolution operation result of the convolution kernel and the two-dimensional input data is obtained.

When the size of the convolution kernel is (2k+1)×c, step S2 further includes the following. Based on the two layers of the non-volatile memory cell arrays between all adjacent two word line electrode layers in the sub-array unit with the size of (M−2(k−1)−1)×N and after achieving in parallel the dot product operation between the convolution kernel units with the size of 2×c and the different parts of the two-dimensional input data, the sum of the dot product operation results of the convolution kernel units with the size of 2×c and the corresponding parts of the two-dimensional input data is output in parallel through the corresponding bit line electrode layer. Based on the non-volatile memory cell array in the sub-array unit with the size of (M−2k)×N and after achieving in parallel the dot product operation between the convolution kernel unit with the size of 1×c and the different parts of the two-dimensional input data, the sum of the dot product operation results of the convolution kernel unit with the size of 1×c and the corresponding parts of the two-dimensional input data is output in parallel through the corresponding bit line electrode layer. Further, the outputs of the bit lines in each selected sub-array unit is summarized, and the convolution operation result of the convolution kernel and the two-dimensional input data is obtained.

In general, the above technical solutions provided by the disclosure have the following beneficial effects:

1. The disclosure provides a convolution operation accelerator. Herein, each word line electrode connects one column of the non-volatile memory cells arranged in a matrix, and each bit line electrode obliquely connects the non-volatile memory cells arranged in a matrix. The input data of each word line may be subjected to a multiply-accumulate operation together with the two upper and lower layers of the convolution kernel units, so that the natural sliding of the convolution kernel units in the y direction in the two-dimensional input is achieved. The oblique bit lines and the multiple copies of the convolution kernel in each layer of the non-volatile memory array may enable the multiplication operation between one piece of input data and the convolution kernel data at different positions in the same convolution kernel. In this way, the natural sliding of the convolution kernel units in the x direction in the two-dimensional input is achieved. Therefore, the convolution calculation can be completed in parallel at one time without expanding the two-dimensional input into one dimension. The data multiplexing rate and the degree of parallel operation are high, and the operation speed is fast. Compared with the conventional planar array, in the disclosure, the high integration characteristic of the three-dimensional array is utilized, more units can be accommodated in a smaller area, more calculations can be performed, and the utilization rate of the array units is greatly improved.

2. The convolution operation accelerator provided by the disclosure considers the cases of odd and even numbers of convolution kernel behaviors and splits and stores them respectively and can achieve in parallel the convolution operation between different split parts and corresponding two-dimensional data. The calculation resource of the three-dimensional non-volatile memory array is fully utilized, and the calculation speed is fast.

3. The convolution operation accelerator provided by the disclosure can be used to achieve the function of the convolution neural network. The input, weight, and output of the neural network are mapped to the input voltage, conductance, and output current of the three-dimensional non-volatile memory. Further, due to the unique design of the topology of the three-dimensional non-volatile memory array, the physical calculation process at the array level can naturally match the convolution kernel sliding operation process that exists in a large number of convolutional neural networks. The convolution operation can be completed at one time while retaining the position information of the two-dimensional data, and the two-dimensional output data is obtained. The calculation process of the convolutional neural network in the software is greatly restored. Besides, fewer input and output ports are used to achieve highly parallel computing of convolution, and resource utilization and computing speed are greatly improved.

4. In the disclosure, based on the convolution operation of the three-dimensional non-volatile memory array, compared to computing units such as CPUs and GPUs in the conventional von Neumann architecture, there is no limitation on the speed of data transmission between memory and computing units. The integration of storing and computing is achieved, so that efficient and large-scale parallel convolutional neural network computing is achieved.

DESCRIPTION OF THE EMBODIMENTS

In order to make the objectives, technical solutions, and advantages of the disclosure clearer and more comprehensible, the disclosure is further described in detail with reference to the drawings and embodiments. It should be understood that the specific embodiments described herein serve to explain the disclosure merely and are not used to limit the disclosure. In addition, the technical features involved in the various embodiments of the disclosure described below can be combined with each other as long as the technical features do not conflict with each other.

Figure 1:
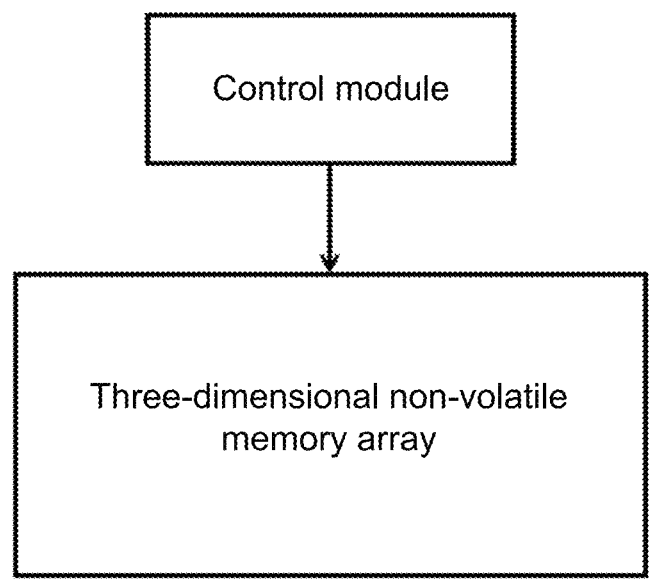
FIG. 1 is a schematic structural diagram of a convolution operation accelerator provided by the first aspect of the disclosure.

To achieve the above, as shown in FIG. 1, the disclosure provides a convolution operation accelerator including a three-dimensional non-volatile memory array and a control module.

Herein, the three-dimensional non-volatile memory array includes P word line electrode layers. A bit line electrode layer is placed between any two adjacent word line electrode layers. A non-volatile memory cell array is placed between any adjacent word line electrode layer and bit line electrode layer, and the non-volatile memory cell array is vertically connected to both the word line electrode layer and the bit line electrode layer. To be specific, the three-dimensional non-volatile memory array is a multi-layered stacked structure and is formed by sequentially stacking the word line electrode layers, the non-volatile memory cell arrays, and the bit line electrode layers. The word line electrode layers and the word line electrode layers and the bit line electrode layers are parallel to each other.

The word line electrode layers include a plurality of word line electrodes arranged in parallel, and the word line electrodes in the P word line electrode layers together form a word line electrode array.

Each column of non-volatile memory cells in the non-volatile memory cell array is connected onto a same word line in the word line electrode layer connected to the non-volatile memory cell array. The non-volatile memory cells on each oblique line in the non-volatile memory cell array are connected onto a same bit line in a bit line electrode array connected to the non-volatile memory cell array. Herein, the oblique line is an oblique line in the non-volatile memory cell array parallel to a corresponding diagonal line in the non-volatile memory cell array.

A size of two-dimensional input data is denoted as M×N.

When a size of a convolution kernel being subjected to a convolution operation with the two-dimensional input data is 2k×c, the control module is configured to split the convolution kernel into k convolution kernel units with a size of 2×c by row, where k is a positive integer, select and arrange k different sub-array units with a size of (M−2(k−1))×N in the word line electrode array to correspond to the k convolution kernel units with the size of 2×c one to one according to a splitting sequence of the convolution kernel, store each convolution kernel unit and N−c copies thereof in the two layers of the non-volatile memory cell arrays between all adjacent two word line electrode layers in the corresponding sub-array unit, and apply data from a 2i−1th row to a M−2(k−i)th row of the two-dimensional input data to the corresponding word line electrode in an ith sub-array unit in the form of voltage according to corresponding coordinate information, where i=1, 2, L, . . . , k.

When the size of the convolution kernel is (2k+1)×c, the control module is configured to split the convolution kernel into k convolution kernel units with a size of 2×c and one convolution kernel unit with a size of 1×c by row, select k sub-array units with a size of (M−2(k−1)−1)×N and one sub-array unit with a size of (M−2k)×N in the word line electrode array, arrange the k sub-array units with the size of (M−2(k−1)−1)×N to correspond to the k convolution kernel units with the size of 2×c one to one according to the splitting sequence of the convolution kernel, store each convolution kernel unit with the size of 2×c and N−c copies thereof in the two layers of the non-volatile memory cell arrays between all adjacent two word line electrode layers in the corresponding sub-array unit, for each word line electrode layer in the sub-array unit with the size of (M−2k)×N, store the convolution kernel unit with the size of 1×c and the N−c copies of the convolution kernel unit with the size of 1×c in one of the non-volatile memory cell arrays connected to it and set all the non-volatile memory cells in the non-volatile memory cell array not storing the convolution kernel unit to a high-impedance state, apply data from the 2i−1th row to a M−2(k−i)−1th row on the two-dimensional input data to the corresponding word line electrode in the ith sub-array unit with the size of (M−2(k−1)−1)×N in the form of voltage according to the corresponding coordinate information, where i=1, 2, L, . . . , k, and apply data from a 2k+1th row to a Mth row on the two-dimensional input data to the corresponding word line electrode in the sub-array unit with the size of (M−2k)×N in the form of voltage according to the corresponding coordinate information.

The three-dimensional non-volatile memory array is configured to achieve in parallel a dot product operation between the convolution kernel units and different parts of the two-dimensional input data based on the non-volatile memory cell array and is configured to output in parallel a sum of dot product operation results of the convolution kernel units and the corresponding parts of the two-dimensional input data via the corresponding bit line electrode layer, so as to achieve the convolution operation between the convolution kernel and the two-dimensional input data.

After being sequentially stored on the corresponding oblique line of the corresponding non-volatile memory cell array, each row of convolution kernel data of the convolution kernel units moves horizontally in a sliding direction of the convolution kernel onto the adjacent N−c oblique lines, and the row of convolution kernel data is stored again. Each layer of the non-volatile memory cell array stores the convolution kernel data of the corresponding row in the convolution kernel unit, and N−c copies of the convolution kernel data are implemented.

To be specific, when the size of the convolution kernel is 2k×c, based on the two layers of the non-volatile memory cell arrays between all adjacent two word line electrode layers in the sub-array unit with the size of (M−2(k−1))×N and after achieving the dot product operation between the convolution kernel units with the size of 2×c and the different parts of the two-dimensional input data in parallel, the three-dimensional non-volatile memory array is configured to output in parallel the sum of the dot product operation results of the convolution kernel units with the size of 2×c and the corresponding parts of the two-dimensional input data through the corresponding bit line electrode layer. The control module is further configured to summarize outputs of bit lines at a same relative position in each selected sub-array unit and obtain a convolution operation result of the convolution kernel and the two-dimensional input data.

When the size of the convolution kernel is (2k+1)×c, based on the two layers of the non-volatile memory cell arrays between all adjacent two word line electrode layers in the sub-array unit with the size of (M−2(k−1)−1)×N and after achieving the dot product operation between the convolution kernel units with the size of 2×c and the different parts of the two-dimensional input data in parallel, the three-dimensional non-volatile memory array is configured to output in parallel the sum of the dot product operation results of the convolution kernel units with the size of 2×c and the corresponding parts of the two-dimensional input data through the corresponding bit line electrode layer, and based on the non-volatile memory cell array in the sub-array unit with the size of (M−2k)×N and after achieving in parallel the dot product operation between the convolution kernel unit with the size of 1×c and the different parts of the two-dimensional input data, outputs in parallel the sum of the dot product operation results of the convolution kernel unit with the size of 1×c and the corresponding parts of the two-dimensional input data through the corresponding bit line electrode layer. The control module is further configured to correspondingly summarize the outputs of the bit lines in each selected sub-array unit and obtain the convolution operation result of the convolution kernel and the two-dimensional input data. Herein, the output of each sub-array unit is (M−2k)×(N−c), and the final convolution operation result can be obtained after the corresponding summation.

In an optional embodiment, when the size of the convolution kernel is 2k×c, at least M−2(k−1) word line layers are selected in a vertical direction, and at least k×N word lines are selected in a horizontal direction. The control module splits the convolution kernel into k convolution kernel units of 2×c size. A three-dimensional non-volatile memory array with k×N word lines in the horizontal direction is treated as k sub-array units with N word lines. One convolution kernel unit with the size of 2×c is mapped to the corresponding position of each sub-array unit, and the two-dimensional input data may also slide on the k array units. For instance, for M×N input data, data from a first row to a M−2(k−1)$^{th}$ row is mapped onto the word line of a first array unit, data from 2+1$^{th}$ row to M−2(k−2)$^{th}$ row is mapped onto the word line of a second array unit, data from 2i−1$^{th}$ row to M−2(k−i) (i∈1, 2, 3, . . . , k)$^{th}$ data is mapped onto the word line of an i$^{th}$ array unit. At this time, the control module is further configured to summarize outputs of the bit lines at a same relative position in the k sub-array units to obtain a final convolution operation result.

When the size of the convolution kernel is (2k+1)×c, the mapping manner of k convolution kernels with the size of 2×c is similar to the method when the size of the convolution kernel is 2k×c. The difference is that the three-dimensional non-volatile memory array with (k+1)×N word lines is selected in the horizontal direction, the three-dimensional non-volatile memory array with (k+1)×N word lines in the horizontal direction is treated as k+1 sub-array units with N word lines, and the data from 2i−1$^{th}$ row to M−2(k−i)−1 (i∈1, 2, 3, . . . , k)$^{th}$ row is mapped onto the word lines of the i$^{th}$ array unit. The remaining convolution kernel unit with the size of 1×c is mapped onto the k+1$^{th}$ array unit. For the two layers of non-volatile memory cells connected by the bit line of each layer, the convolution kernel unit with the size of 1×c and its N−c copies are stored in the non-volatile memory cell array above (or below), and all the non-volatile memory cells below (or above) the bit line are set to a high-impedance state (considered as an open circuit). In this specific embodiment, M−2 (k−1)−1 word line layers are selected in the vertical direction, and (k+1)×N word lines are selected in the horizontal direction. When the convolution kernel unit with the size of 1×c is stored on the upper non-volatile memory cell array, the data from the $2k+1^{th}$ row to the $M^{th}$ row in the two-dimensional input data are mapped onto the 1st layer to the $M-2k^{th}$ layer from top to bottom. When the convolution kernel unit with the size of 1×c is stored on the lower non-volatile memory cell array, the data from the $2k+1^{th}$ row to the $M^{th}$ row in the two-dimensional input data are mapped onto the 2nd layer to the $M-2k+1^{th}$ layer from top to bottom. At this time, the control module is further configured to summarize the outputs of the bit lines at the same relative position in the k+1 sub-array units to obtain the final convolution operation result.

In order to further illustrate the convolution operation accelerator provided by the disclosure, detailed description is provided as follows in combination with specific embodiments:

Embodiment 1

Figure 2:
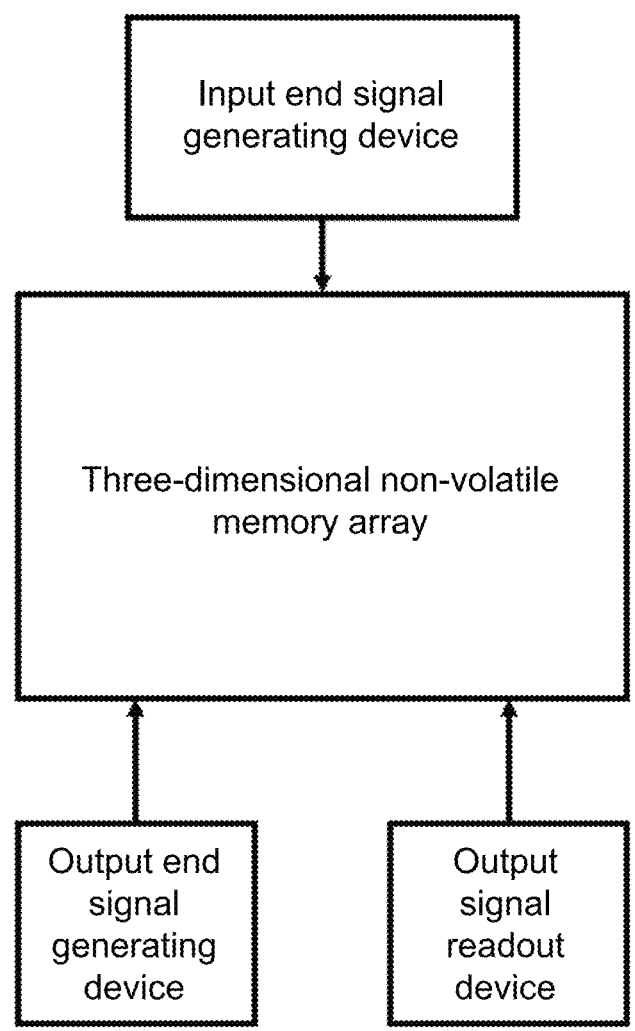
FIG. 2 is a schematic structural diagram of the convolution operation accelerator provided by Embodiment 1 of the disclosure.

As shown in FIG. 2, the convolution operation accelerator in this embodiment includes the three-dimensional non-volatile memory array and the control module. The control module includes an input end signal generating device, an output end signal generating device, and an output signal readout device.

Figure 3:
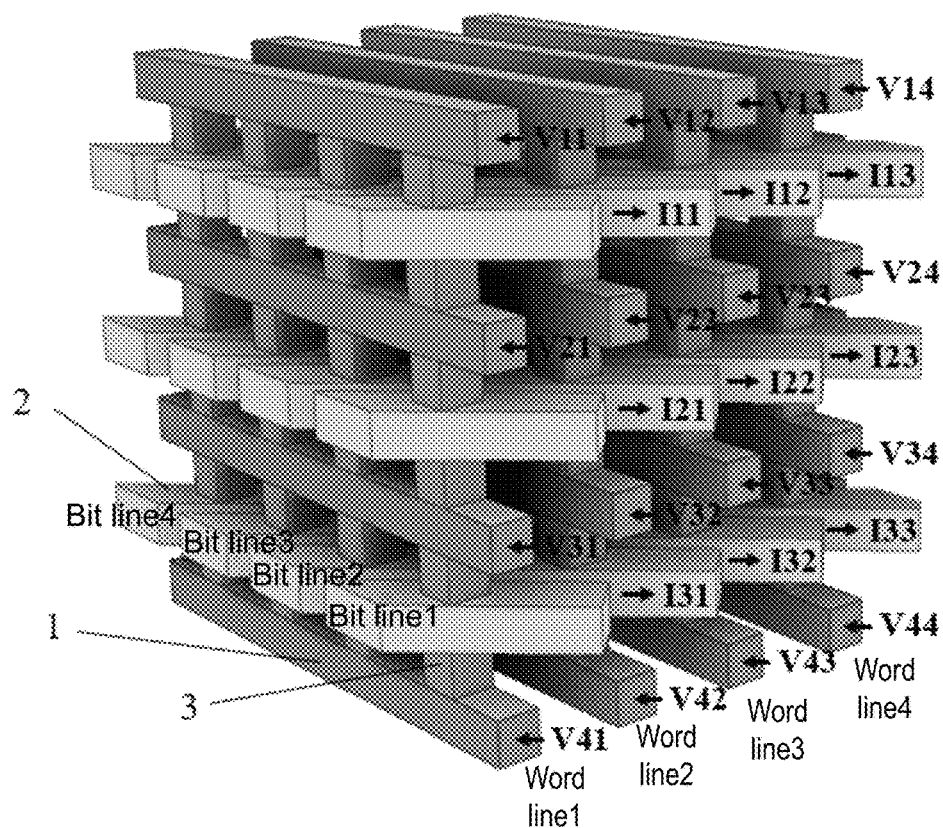
FIG. 3 is a schematic structural diagram of a three-dimensional non-volatile memory array provided by Embodiment 1 of the disclosure.

FIG. 3 is a schematic structural diagram of the three-dimensional non-volatile memory array including a word line electrode 1, a bit line electrode 2, and a non-volatile memory cell 3. The input end signal generating device is connected to the word line electrode, and the output end signal generating device and the output signal readout device are connected to the bit line electrode. V11 to V44 are applied to the word line electrode in the form of voltage as input, and I11 to I33 are output currents obtained after the input voltage is applied to the non-volatile memory cell array.

Figure 4:
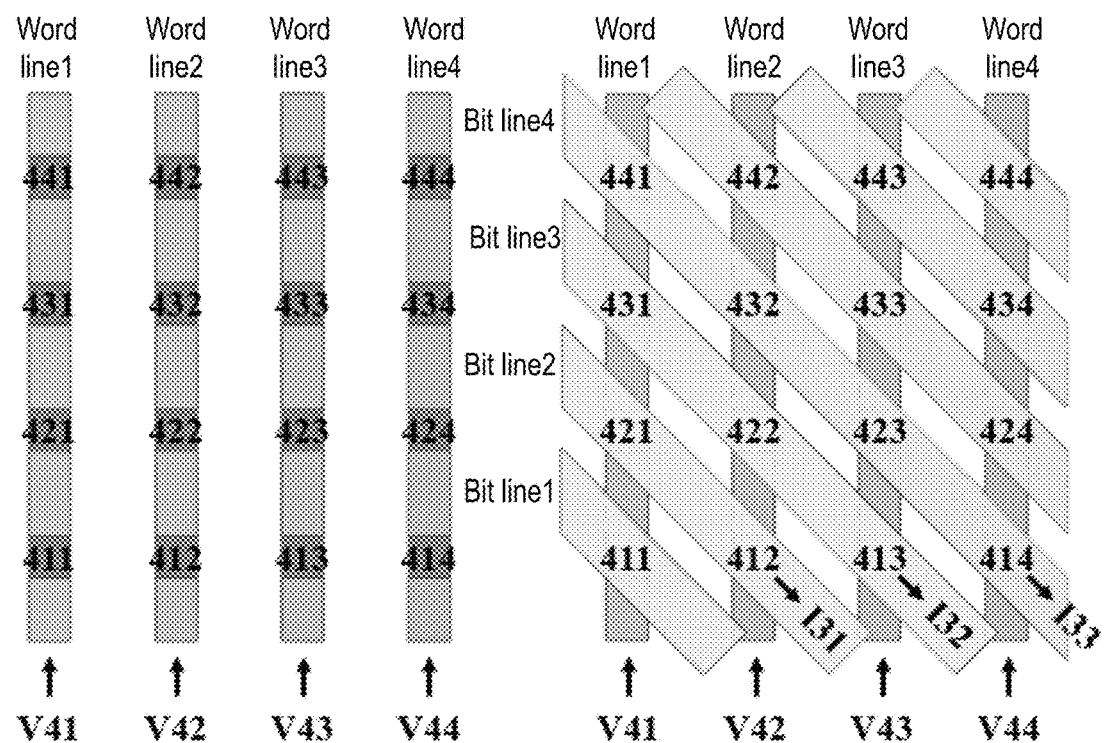
FIG. 4 is a top cross-sectional view of a three-dimensional non-volatile memory provided by Embodiment 1 of the disclosure.

In order to further illustrate the internal connection structure of the three-dimensional non-volatile memory array, FIG. 4 shows a top cross-sectional view of a three-dimensional non-volatile memory. The top cross-sectional view shown on the left is a two-layered structure formed by the word line electrode and the non-volatile memory cell array, and the non-volatile memory cell array is above the word line electrode. Word lines 1 to 4 are electrodes arranged in parallel, and non-volatile memory cells are evenly distributed on each word line. Non-volatile memory cells 411 to 441 are connected to the word line 1, non-volatile memory cells 412 to 442 are connected to the word line 2, non-volatile memory cells 413 to 443 are connected to the word line 3, and non-volatile memory cells 414 to 444 are connected to the word line 4. In the top sectional view shown on the right, a layer of bit line electrode is added on the basis of the top sectional view on the left, and from bottom to top are word line electrode, non-volatile memory array, and bit line electrode. The bit line electrode is arranged in parallel but forms a specific angle with the direction of the word line electrode. The non-volatile memory cell 411 is connected to the bit line 1, the non-volatile memory cells 421 and 412 are connected to the bit line 2, the non-volatile memory cells 431, 422, and 413 are connected to the bit line 3, and the non-volatile memory cells 441, 432, 423, and 414 are connected to the bit line 4.

It should be noted that, in the three-dimensional non-volatile memory array, each word line connects one column of the non-volatile memory cells arranged in a matrix, and each bit line obliquely connects the non-volatile memory cells arranged in a matrix. The input data of each word line may be subjected to a multiply-accumulate operation together with the two upper and lower layers of the convolution kernel units, so that the natural sliding of the convolution kernel units in the y direction in the two-dimensional input is achieved. The oblique bit lines and the multiple copies of the convolution kernel in each layer of the non-volatile memory array may enable the multiplication operation between one piece of input data and the convolution kernel data at different positions in the same convolution kernel. In this way, the natural sliding of the convolution kernel in an x direction in the two-dimensional input is achieved. Therefore, the convolution calculation can be completed in parallel at one time without expanding the two-dimensional input into one dimension, so the operation speed is extremely fast.

Further, the input end signal generating device is matched with the output end signal generating device. A voltage is applied to the word line electrodes and the bit line electrodes corresponding to the sub-array units. The corresponding non-volatile memory cells are selected, and a conductance value of each selected non-volatile memory cell is changed to store the corresponding convolution kernel data.

The input end signal generating device is further configured to apply the two-dimensional input data to the corresponding word line electrodes in the sub-array units in the form of voltage according to the coordinate information of the two-dimensional input data.

The output signal readout device is configured to detect output currents on the bit line electrodes and convert the output currents into a voltage signal as the convolution operation result.

To be specific, during the convolution operation, the input end signal generating device is configured to apply the voltage corresponding to the input data to the corresponding word line electrode, and at this time, a voltage amplitude does not exceed a set voltage of the non-volatile memory unit. The output signal readout device is configured to convert the output current on the bit line electrode into a voltage and read out the voltage value as the convolution operation result.

It should be noted that the convolution operation accelerator is configured to achieve the convolution operation in a convolution neural network. At this time, the word line electrodes of the three-dimensional non-volatile memory array at as the input of the convolutional neural network, and each layer of word line electrodes corresponds to a row in the two-dimensional input of the convolutional neural network. Each layer of the non-volatile memory array corresponds to one row in the convolution kernel, and each layer of the bit line electrodes corresponds to one row in the two-dimensional output of the neural network. The input end signal generating device is configured to apply a voltage on the word line electrode. The applied voltage has two purposes, the first purpose is to use the voltage to represent the input data, and the adjusted conductance value is used to obtain the current output to complete the forward propagation operation of the neural network. The second purpose is to allow a voltage to be applied on the word line electrode, a non-volatile memory cell matched with the bit line electrode to be selected, and the conductance value of the selected non-volatile memory cell to be changed. The output end signal generating device is configured to apply a voltage on the word line electrode, select a non-volatile memory cell matched with the bit line electrode, and change the conductance value of the selected non-volatile memory cell. The output signal readout device is configured to detect an output current on the bit line electrode and convert the output current into a voltage signal as the convolution operation result. In addition, during a training process of the convolutional neural network, the control module is further configured to adjust the conductance value of each non-volatile memory cell by applying a write voltage on the corresponding word line electrode and bit line electrode to update a parameter of the convolutional neural network and re-uses the convolution operation result of a previous round of the convolution operation accelerator as input of a next round of convolution operation of the convolution operation accelerator. To be specific, the input end signal generating device is configured to apply a voltage of a specific amplitude on the word line electrode connected to the non-volatile memory cell that needs conductance regulation. Further, the output end signal generating device applies a voltage of a specific amplitude to the bit line electrode connected to the non-volatile memory cell that needs conductance regulation. When a voltage is applied to both the word line electrode and the bit line electrode at both ends of a non-volatile memory cell, it means that this unit is selected. The voltage applied solely by the input end signal generating device or the output end signal generating device cannot change the conductance value of the non-volatile memory cell. The absolute value after subtracting the write voltages applied by the input end signal generating device and the output end signal generating device is required to be equal to the set voltage value (set voltage) or reset voltage value (reset voltage), depending on whether the conductance value needs to be increased or decreased during the update process. At this time, the voltage difference between the two ends of the unit is equal to the set voltage or reset voltage of the unit. To be specific, when the conductance needs to be increased, the voltages on both sides of the non-volatile memory cell is equal to the set voltage. When the conductance needs to be decreased, the voltages on both sides of the non-volatile memory cell is equal to the reset voltage until it is regulated to the conductance value corresponding to the weight of the convolution kernel.

In the second aspect, the disclosure provides a convolution operation method based on the abovementioned convolution operation accelerator, and the method includes the following steps.

In step S1, when a size of a convolution kernel being subjected to a convolution operation with two-dimensional input data is $2k \times c$, the convolution kernel is split into k convolution kernel units with a size of $2 \times c$ by row, where k is a positive integer. k different sub-array units with a size of $(M-2(k-1)) \times N$ are selected and arranged in a word line electrode array to correspond to the k convolution kernel units with the size of $2 \times c$ one to one according to the splitting sequence of the convolution kernel. Each convolution kernel unit and N−c copies thereof are stored in two layers of non-volatile memory cell arrays between all adjacent two word line electrode layers in a corresponding sub-array unit. Data from a 2i−1th row to a M−2(k−i)th row of the two-dimensional input data is applied to a corresponding word line electrode in an ith sub-array unit in the form of voltage according to corresponding coordinate information, where i=1, 2, L, . . . , k.

When the size of the convolution kernel is $(2k+1) \times c$, the convolution kernel is split into k convolution kernel units with a size of $2 \times c$ and one convolution kernel unit of a size of $1 \times c$ by row. k sub-array units with the size of $(M-2(k-1)-1) \times N$ and one sub-array unit with the size of $(M-2k) \times N$ are selected in the word line electrode array. The k sub-array units with the size of $(M-2(k-1)-1) \times N$ are arranged to correspond to the k convolution kernel units with the size of $2 \times c$ one to one according to the splitting sequence of the convolution kernel. Each convolution kernel unit with the size of $2 \times c$ and N−c copies thereof are stored in the two layers of the non-volatile memory cell arrays between all adjacent two word line electrode layers in the corresponding sub-array unit. For each word line electrode layer in the sub-array unit with the size of $(M-2k) \times N$, the convolution kernel unit with the size of $1 \times c$ and the N−c copies of the convolution kernel unit with the size of $1 \times c$ in one of the non-volatile memory cell arrays connected to it are stored, and all the non-volatile memory cells in the non-volatile memory cell array not storing the convolution kernel unit are set to a high-impedance state. Data from the 2i−1th row to the M−2(k−i)−1th row on the two-dimensional input data is applied to the corresponding word line electrode in the ith sub-array unit with the size of $(M-2(k-1)-1) \times N$ in the form of voltage according to corresponding coordinate information, where i=1, 2, L, . . . , k. Data from the 2k+1th row to the Mth row on the two-dimensional input data is applied to the corresponding word line electrode in the sub-array unit with the size of $(M-2k) \times N$ in the form of voltage according to the corresponding coordinate information.

To be specific, by selecting a non-volatile memory cell in the word line and the bit line, applying a voltage on the word line and the bit line increases or decreases the conductance value of the selected non-volatile memory cell. In the above process, the conductance value of the selected unit is compared with a target conductance value, and if they are not equal, a voltage pulse is applied across the unit through the word line and the bit line to make the conductance value equal to the target conductance value. The ultimate goal is to regulate the conductance value of the non-volatile memory cell to the corresponding convolution kernel data.

Further, when two-dimensional data is input, the two-dimensional input data is converted into a corresponding voltage value and is applied onto the corresponding word line electrode through the input end signal generating device. Herein, the two-dimensionally arranged input data corresponds to the two-dimensionally arranged word line electrodes one to one according to the coordinate information.

In step S2, a dot product operation between the convolution kernel units and the different parts of the two-dimensional input data is achieved in parallel based on the non-volatile memory cell array, and a sum of dot product operation results of the convolution kernel units and the corresponding parts of the two-dimensional input data are outputted in parallel via the corresponding bit line electrode layer, so as to achieve the convolution operation between the convolution kernel and the two-dimensional input data.

Herein, a size of two-dimensional input data is denoted as M×N. After being sequentially stored on the corresponding oblique line of the corresponding non-volatile memory cell array, each row of convolution kernel data of the convolution kernel units moves horizontally in the sliding direction of the convolution kernel onto the adjacent N−c oblique lines, and the row of convolution kernel data is stored again. Each layer of the non-volatile memory cell array stores the convolution kernel data of the corresponding row in the convolution kernel unit, and N−c copies of the convolution kernel data are implemented.

To be specific, after the voltage applied on the word line electrode acts on the non-volatile memory array, a current is generated on the bit line electrode, and the output signal readout device is used to convert the current on the bit line into a voltage to obtain an output voltage matrix.

In order to further illustrate the convolution operation method provided by the disclosure, detailed description is provided as follows in combination with specific embodiments:

Embodiment 2

In order to further illustrate the convolution operation method and its advantages based on the three-dimensional non-volatile memory array provided by the disclosure, the technical details of the convolution operation method provided by the disclosure is to be described below by taking a 4×4 image as input information and a 2×2 convolution kernel as an example.

Figure 5:
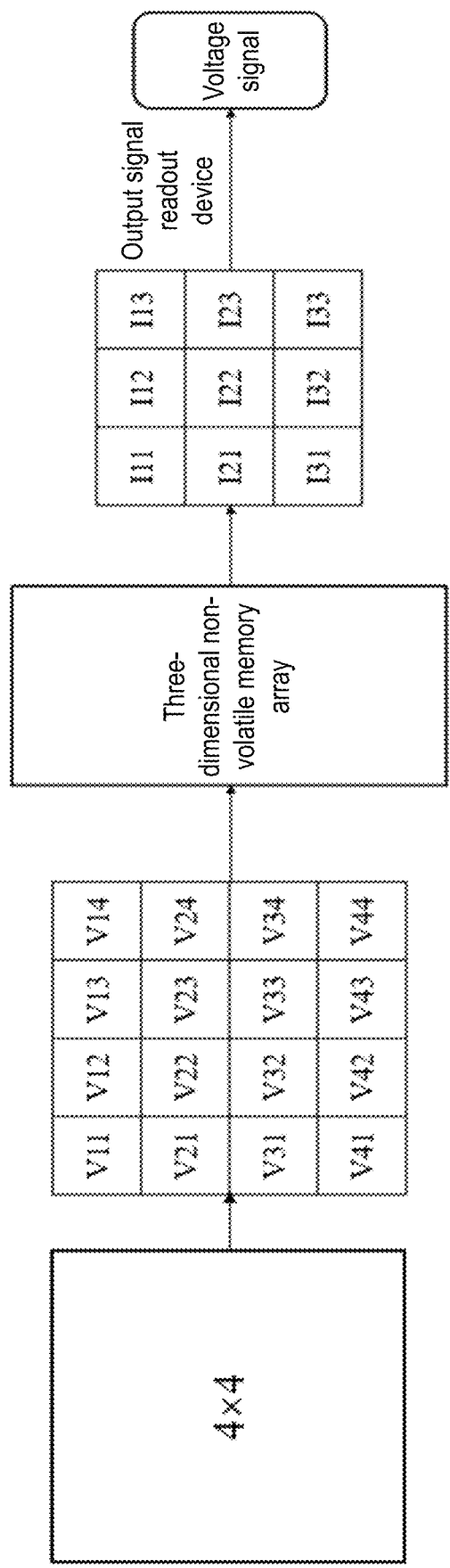
FIG. 5 is a flow chart of a convolution operation of the three-dimensional non-volatile memory array based on Embodiment 1 provided by Embodiment 2 of the disclosure.

FIG. 5 shows a flow chart of a convolution operation based on the three-dimensional non-volatile memory array described in Embodiment 1, and the following steps are included.

In A1, a total of 16 pixel values in a 4×4 picture are mapped to voltage values, and word line electrodes corresponding to the mapped voltage values are determined.

To be specific, pixel values within a range of 0 to 255 are linearly mapped to voltage values within a specific range. This voltage range is selected according to different types of non-volatile memories, and follows the principle that the maximum voltage value does not exceed the set voltage of the non-volatile memory. Assuming that the set voltage of the non-volatile memory is $V_{set}$, the voltage value corresponding to the pixel value is $$\frac{P}{255} \times V_{set},$$

where P is the pixel value, and 255 is the maximum value of the pixel value. For instance, if $V_{set}$ is 1V, the mapped voltage range is 0 to 1V. When the pixel value is 127.5, the voltage value after the pixel value mapping is $$\frac{127.5}{255} \times 1 = 0.5 \text{ V}.$$

To be specific, the voltage value mapped to the pixel value of the first row and the first column in the 4×4 image corresponds to V11 in FIG. 3 and is input into the word line electrode corresponding to V11. The voltage value mapped to the pixel value of the second row and the first column corresponds to V12 in FIG. 3, and the rest may be deduced by analogy. The 4×4 voltage matrix formed by the V11 to V44 in FIG. 5 corresponds to the pixel points in the 4×4 image one to one.

In A2, the 2×2 convolution kernel weights are mapped onto the non-volatile memory array, that is, the positions of the convolution kernel weights on the non-volatile memory array are assigned.

Figure 6:
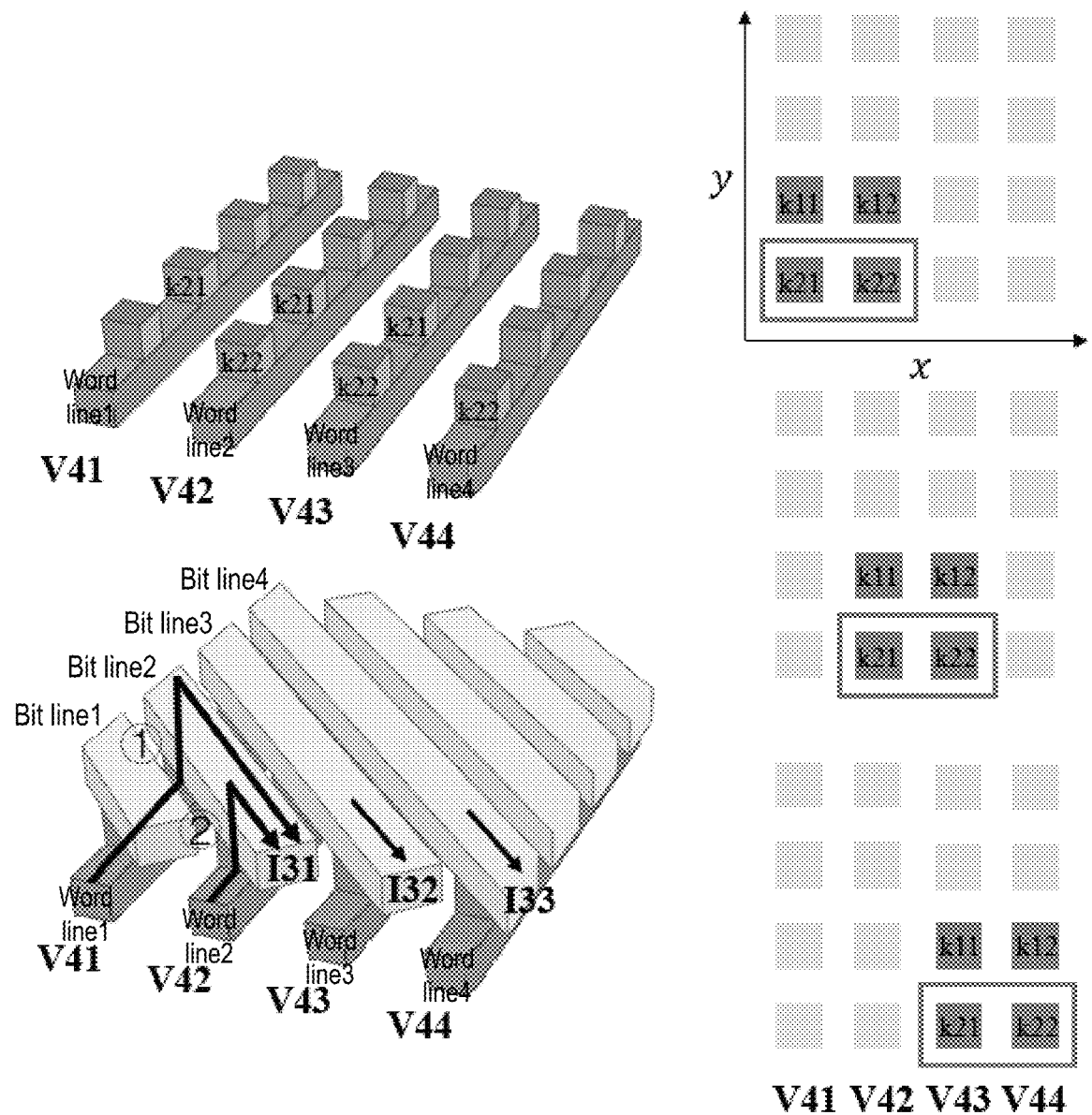
FIG. 6 is a schematic diagram of the three-dimensional non-volatile memory array provided by Embodiment 2 of the disclosure naturally matching sliding of a convolution kernel in a convolution neural network in an x direction of input data for a multiply-accumulate operation.

To be specific, taking the mapping manner of one layer of non-volatile memory array in FIG. 6 as an example, V41 to V44 corresponds to the voltage values of the fourth row data of the input image data, and k11 to k22 are the weights of the 2×2 convolution kernel. Herein, k11 and k12 are the weights of the first row in the convolution kernel, and k21 and k22 are the weights of the second row in the convolution kernel. According to the convolution operation rules, the weight of the second row in the convolution kernel needs to slid on the input data of the fourth row to be subjected to a multiply-accumulate operation and needs to slid three times on V41 to V44 corresponding to k21 and k22. Therefore, k21 and k22 are copied three times and are mapped to the positions shown in the upper left figure in FIG. 5, corresponding to the positions 421 and 412, 422 and 413, and 423 and 414 in FIG. 4. The convolution kernel mapping manner of other non-volatile memory layers may be deduced by analogy.

Figure 7:
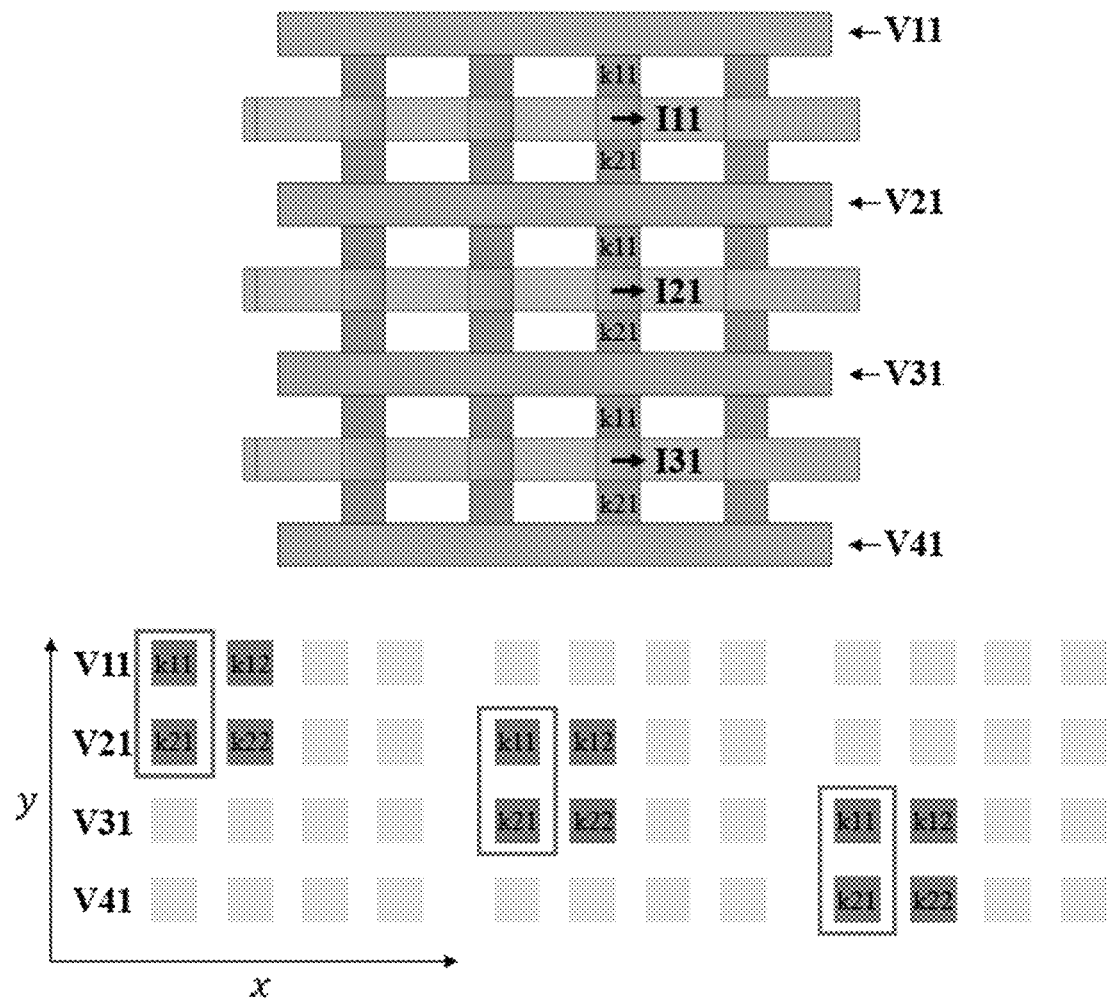
FIG. 7 is a schematic diagram of the three-dimensional non-volatile memory array provided by Embodiment 2 of the disclosure naturally matching the sliding of the convolution kernel in the convolution neural network in a y direction of the input data for a multiply-accumulate operation.

FIG. 7 is a side view of a three-dimensional non-volatile memory, showing a mapping scheme of convolution kernels on other non-volatile memory cell array layers. Herein, V11 to V41 are the voltage values corresponding to the first column data of the input image data. Taking V21 as an example, during the sliding process of the convolution kernel in the convolution operation, it is necessary to perform multiplication operations with k21 and k11. Therefore, k21 and k11 are mapped to the two upper and lower layers of the non-volatile memory cells connected to the word line electrodes corresponding to V21, and the convolution kernel mapping manner in each non-volatile memory array layer may be deduced by analogy in combination with FIG. 6 and the content described in the previous paragraphs. Therefore, three copies of a 2×2 convolution kernel are completely mapped to every two layers of the non-volatile memory cell arrays, and the convolution kernel also needs to slide three times in the y direction, so six layers of the non-volatile memories are required.

In A3, the conductance value of the non-volatile memory array is regulated according to the weight value of the convolution kernel.

To be specific, the weight of the non-volatile memory cell is regulated by applying voltages on the word lines and the bit lines. When the conductance needs to be increased, the voltages on both sides of the non-volatile memory cell is equal to the set voltage. When the conductance needs to be decreased, the voltages on both sides of the non-volatile memory cell is equal to the reset voltage until it is regulated to the conductance value corresponding to the weight of the convolution kernel.

In A4, after inputting a 4×4 voltage matrix to the corresponding word line electrode, a 2×2 output current matrix is obtained on the bit line electrode through the non-volatile memory array, that is, I11 to I33 are obtained from V11 to V44.

To be specific, as shown in the lower left figure in FIG. 6, V41 is applied onto the word line 1. According to the current path shown in ①, the current is obtained on the bit line 2 after passing through k21, and V42 is applied to the word line 2. According to the current path shown in ②, the current is obtained on the bit line 2 after passing through k22. Similarly, in FIG. 7, V31 and V32 obtain current on the bit line 2 after passing through k11 and k12 respectively, and the four currents converge on the bit line 2 to form I31, that is I31=V31×k11+V32×k12+V41×k21+V42×k22. At the same time, V42 also generates current on the bit line 3 through k21, that is I32=V32×k11+V33×k12+V42×k21+V43×k22. V42 and V32 participate in the two multiply-accumulate operations generated by the sliding of the convolution kernel in the x direction in the convolution operation, so the reuse of input data is achieved. Further, in FIG. 3 and FIG. 7, V21 to V24 and V31 to V34 act on the two upper and lower layers of the non-volatile memory arrays connected to the word line electrodes and participate in the two multiply-accumulate operations generated by the sliding of the convolution kernel in the y direction in the convolution operation, so the reuse of input data is achieved.

After the 4×4 voltage matrix is copied to the conductance array of the 2×2 convolution kernels, the 3×3 output current matrix is obtained.

In A5, the output current matrix is linearly converted into a voltage matrix through the output signal readout device, and the voltage is passed to the next convolution operation as input or is stored as the final output of the convolution operation.

Embodiment 3

In order to further illustrate the convolution operation method and its advantages based on the three-dimensional non-volatile memory array provided by the disclosure, the technical details of the convolution operation method provided by the disclosure is to be described below by taking a 3×3 convolution kernel as an example.

Figure 8:
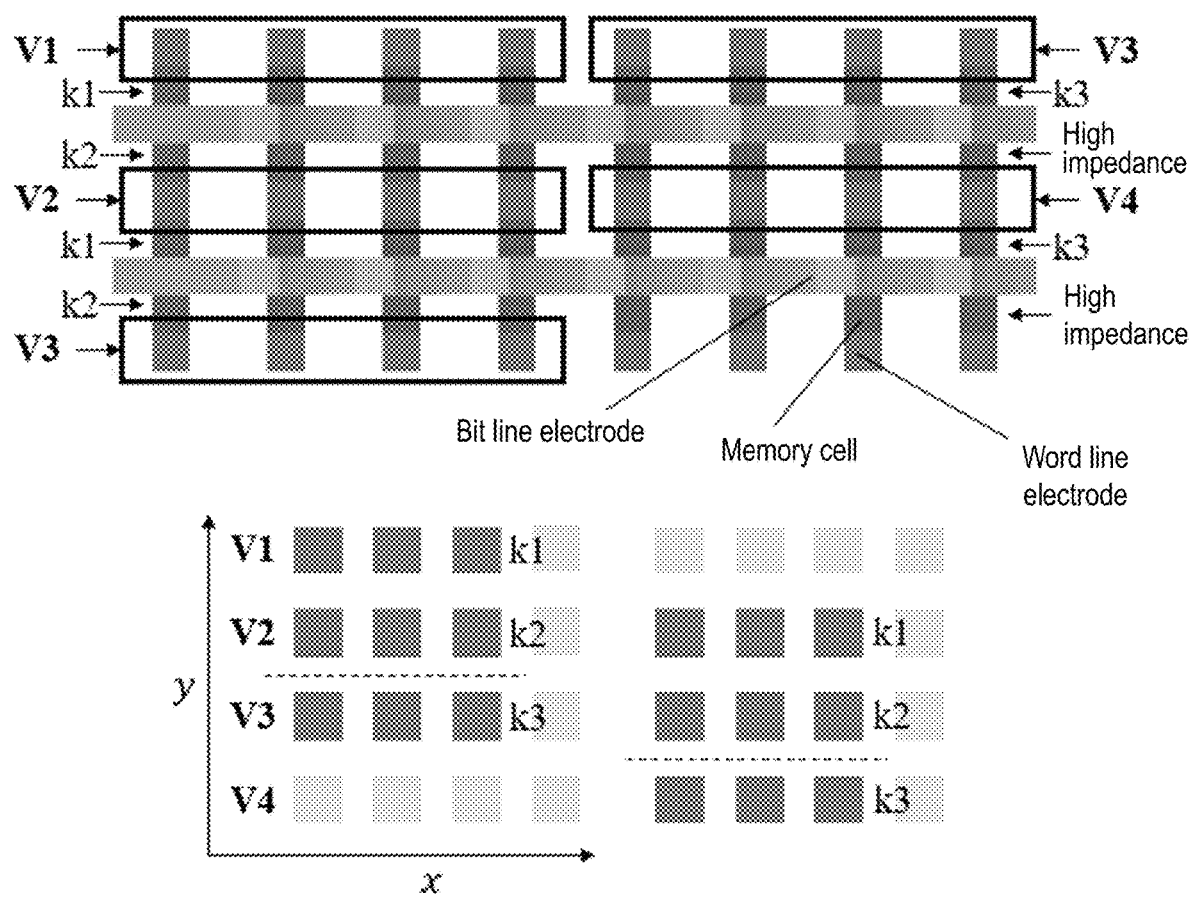
FIG. 8 is a front view of a three-dimensional non-volatile storage array having eight word lines in a horizontal direction provided by Embodiment 3 of the disclosure.

FIG. 8 is a front view of a three-dimensional non-volatile memory array having eight word lines in the horizontal direction and shows the mapping scheme of the 3×3 convolution kernel on the multi-layered non-volatile memory cell layers, and the input data is 4×4 in size. The 3×3 convolution kernel is divided into 2×3 and 1×3 parts for convolution operation individually, that is, regarding k1, k2, and k3 at the bottom of FIG. 8, k1, k2, and k3 correspond to the first, second, and third rows of the 3×3 convolution kernel, respectively. V1, V2, V3, and V4 correspond to the first, second, third, and fourth lines of the 4×4 input. V1 to V3 and k1 and k2 are mapped to the arrays corresponding to the four word lines on the upper left of FIG. 8, and V1 to V3 are sequentially input to the first layer, the second layer, and the third layer word line electrodes. k1, k2, k1, and k2 are respectively mapped to the first layer, the second layer, the third layer, and the fourth layer of non-volatile memory cell layers, and the arrays corresponding to the four word lines on the left complete the convolution operations of k1 and k2. V3, V4, and k3 are mapped to the arrays corresponding to the four word lines on the upper right side of FIG. 8, and V3 and V4 are input to the first layer and the second layer of the word line electrodes. k3 is mapped to both the first layer and the third layer of non-volatile memory cell layers, the non-volatile memory cells of the second layer and the fourth layer of non-volatile memory cell layers are all set to a high-resistance state, and the array corresponding to the four word lines on the left completes the convolution operation of k3. The mapping scheme of each layer is shown in FIG. 9.

Figure 9:
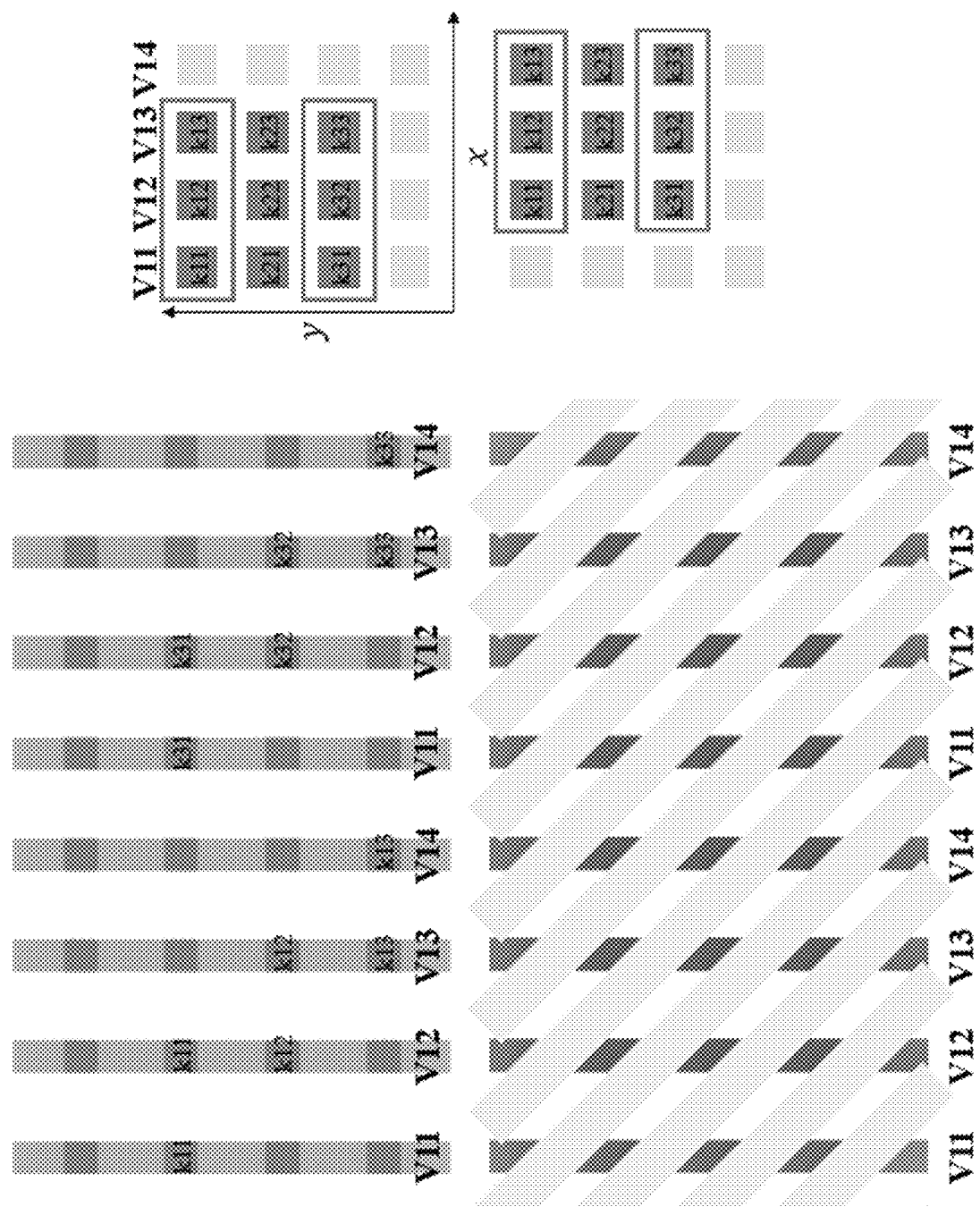
FIG. 9 is a top cross-sectional view of the three-dimensional non-volatile storage array having eight word lines in the horizontal direction provided by Embodiment 3 of the disclosure.

FIG. 9 is a top cross-sectional view of the three-dimensional non-volatile memory array having eight word lines in the horizontal direction and shows the mapping scheme of the 3×3 convolution kernel on the one-layered non-volatile memory cell layer. V11 to V14 are the input of the first row, and the convolution kernels k11 to k13 in the first row and the convolution kernels k31 to k33 in the third row are treated as examples to show the mapping scheme on a one-layered non-volatile memory cell layer. V11 to V14 are input to the left 4 word lines, and in the non-volatile memory cell layer corresponding to the left 4 word lines, k11 to k13 are mapped onto the diagonal line and copied in parallel once. V11 to V14 are input to the right 4 word lines, and in the non-volatile memory cell layer corresponding to the right 4 word lines, k31 to k33 are mapped onto the diagonal line and copied in parallel once.

The relevant technical solutions are the same as those in Embodiment 1 and Embodiment 2, and repeated description is not provided herein.

In view of the foregoing, the disclosure provides an operation accelerator and an operation method for a convolution neural network based on a three-dimensional non-volatile memory array. The three-dimensional non-volatile memory array is formed by stacking basic cells formed by sequentially stacking one layer of word line electrodes, one layer of non-volatile memory cells, one layer of bit line electrodes, and one layer of planar non-volatile memory cell arrays. Each word line electrode acts as the input end of the convolution operation, and the convolution operation is performed through the corresponding non-volatile memory array, and the output of the convolution operation is obtained after the current is superimposed on the bit line. The three-dimensional non-volatile memory array provided by the disclosure has a unique topological structure. In the convolution operation, the process of the convolution kernel sliding on the input data to be subjected to the multiply-accumulate operation can be naturally matched, the convolution operation is performed on the two-dimensional input data at one time, and the two-dimensional output data is thus obtained. Compared to the related art, the position information of the input data matrix is not destroyed, the data output in matrix form can be obtained, and the logic of convolution operation in software is matched. Further, the degree of parallelism is high, the degree of integration is high, and an increasing number of calculations can be obtained under a small occupied area.

A person having ordinary skill in the art should be able to easily understand that the above description is only preferred embodiments of the disclosure and is not intended to limit the disclosure. Any modifications, equivalent replacements, and modifications made without departing from the spirit and principles of the disclosure should fall within the protection scope of the disclosure.

What is claimed is:

1. A convolution operation accelerator, comprising: a three-dimensional non-volatile memory array and a control module, wherein the three-dimensional non-volatile memory array comprises P word line electrode layers, a bit line electrode layer is placed between any two adjacent word line electrode layers, a non-volatile memory cell array is placed between any adjacent word line electrode layer and bit line electrode layer, and the non-volatile memory cell array is vertically connected to both the word line electrode layer and the bit line electrode layer, the word line electrode layers comprise a plurality of word line electrodes arranged in parallel, and the word line electrodes in the P word line electrode layers together form a word line electrode array, each column of non-volatile memory cells in the non-volatile memory cell array is connected onto a same word line in the word line electrode layer connected to the non-volatile memory cell array, the non-volatile memory cells on each oblique line in the non-volatile memory cell array are connected onto a same bit line in a bit line electrode array connected to the non-volatile memory cell array, and the oblique line is an oblique line in the non-volatile memory cell array parallel to a corresponding diagonal line in the non-volatile memory cell array, a size of two-dimensional input data is denoted as M×N, when a size of a convolution kernel being subjected to a convolution operation with the two-dimensional input data is 2k×c, the control module is configured to split the convolution kernel into k convolution kernel units with a size of 2×c by row, where k is a positive integer, select and arrange k different sub-array units with a size of (M−2(k−1))×N in the word line electrode array to correspond to the k convolution kernel units with the size of 2×c one to one according to a splitting sequence of the convolution kernel, store each convolution kernel unit and N−c copies thereof in the two layers of the non-volatile memory cell arrays between all adjacent two word line electrode layers in the corresponding sub-array unit, and apply data from a $2i-1^{th}$ row to a $M-2(k-i)^{th}$ row of the two-dimensional input data to the corresponding word line electrode in an $i^{th}$ sub-array unit in the form of voltage according to corresponding coordinate information, where i=1, 2, L, . . . , k, when the size of the convolution kernel being subjected to the convolution operation with the two-dimensional input data is (2k+1)×c, the control module is configured to split the convolution kernel into k convolution kernel units with a size of 2×c and one convolution kernel unit with a size of 1×c by row, select k sub-array units with a size of (M−2(k−1)−1)×N and one sub-array unit with a size of (M−2k)×N in the word line electrode array, arrange the k sub-array units with the size of (M−2(k−1)−1)×N to correspond to the k convolution kernel units with the size of 2×c one to one according to the splitting sequence of the convolution kernel, store each convolution kernel unit with the size of 2×c and N−c copies thereof in the two layers of the non-volatile memory cell arrays between all adjacent two word line electrode layers in the corresponding sub-array unit, for each word line electrode layer in the sub-array unit with the size of (M−2k)×N, store the convolution kernel unit with the size of 1×c and the N−c copies of the convolution kernel unit with the size of 1×c in one of the non-volatile memory cell arrays connected to it and set all the non-volatile memory cells in the non-volatile memory cell array not storing the convolution kernel unit to a high-impedance state, apply data from the $2i-1^{th}$ row to a $M-2(k-i)-1^{th}$ row on the two-dimensional input data to the corresponding word line electrode in the $i^{th}$ sub-array unit with the size of (M−2(k−1)−1)×N in the form of voltage according to the corresponding coordinate information, where i=1, 2, . . . , k, and apply data from a $2k+1^{th}$ row to a $M^{th}$ row on the two-dimensional input data to the corresponding word line electrode in the sub-array unit with the size of (M−2k)×N in the form of voltage according to the corresponding coordinate information, the three-dimensional non-volatile memory array is configured to achieve in parallel a dot product operation between the convolution kernel units and different parts of the two-dimensional input data based on the non-volatile memory cell array and is configured to output in parallel a sum of dot product operation results of the convolution kernel units and the corresponding parts of the two-dimensional input data via the corresponding bit line electrode layer, so as to achieve the convolution operation between the convolution kernel and the two-dimensional input data, wherein after being sequentially stored on the corresponding oblique line of the corresponding non-volatile memory cell array, each row of convolution kernel data of the convolution kernel units moves horizontally in a sliding direction of the convolution kernel onto the adjacent N−c oblique lines, the row of convolution kernel data is stored again, each layer of the non-volatile memory cell array stores the convolution kernel data of the corresponding row in the convolution kernel unit, and N−c copies of the convolution kernel data are implemented.

2. The convolution operation accelerator according to claim 1, wherein comprising: when the size of the convolution kernel is 2k×c, based on the two layers of the non-volatile memory cell arrays between all adjacent two word line electrode layers in the sub-array unit with the size of (M−2(k−1))×N and after achieving the dot product operation between the convolution kernel units with the size of 2×c and the different parts of the two-dimensional input data in parallel, the three-dimensional non-volatile memory array is configured to output in parallel the sum of the dot product operation results of the convolution kernel units with the size of 2×c and the corresponding parts of the two-dimensional input data through the corresponding bit line electrode layer, the control module is further configured to summarize outputs of bit lines at a same relative position in each selected sub-array unit and obtain a convolution operation result of the convolution kernel and the two-dimensional input data, when the size of the convolution kernel is (2k+1)×c, based on the two layers of the non-volatile memory cell arrays between all adjacent two word line electrode layers in the sub-array unit with the size of (M−2(k−1)−1)×N and after achieving the dot product operation between the convolution kernel units with the size of 2×c and different parts of the two-dimensional input data in parallel, the three-dimensional non-volatile memory array is configured to output in parallel the sum of the dot product operation results of the convolution kernel units with the size of 2×c and the corresponding parts of the two-dimensional input data through the corresponding bit line electrode layer, and based on the non-volatile memory cell array in the sub-array unit with the size of (M−2k)×N and after achieving in parallel the dot product operation between the convolution kernel unit with the size of 1×c and the different parts of the two-dimensional input data, is configured to output in parallel the sum of the dot product operation results of the convolution kernel unit with the size of 1×c and the corresponding parts of the two-dimensional input data through the corresponding bit line electrode layer, the control module is further configured to correspondingly summarize the outputs of the bit lines in each selected sub-array unit and obtain the convolution operation result of the convolution kernel and the two-dimensional input data.

3. The convolution operation accelerator according to claim 1, wherein the three-dimensional non-volatile memory array is a multi-layer stacked structure and is formed by sequentially stacking the word line electrode layers, the non-volatile memory cell arrays, and the bit line electrode layers, and the word line electrode layers and the word line electrode layers and the bit line electrode layers are parallel to each other.

4. The convolution operation accelerator according to claim 1, wherein the control module comprises an input end signal generating device, an output end signal generating device, and an output signal readout device, the input end signal generating device is matched with the output end signal generating device, a voltage is applied to the word line electrodes and the bit line electrodes corresponding to the sub-array units, the corresponding non-volatile memory cells are selected, and a conductance value of each selected non-volatile memory cell is changed to store the corresponding convolution kernel data, the input end signal generating device is further configured to apply the two-dimensional input data to the corresponding word line electrodes in the sub-array units in the form of voltage according to the coordinate information of the two-dimensional input data, the output signal readout device is configured to detect output currents on the bit line electrodes and convert the output currents into a voltage signal as the convolution operation result.

5. The convolution operation accelerator according to claim 4, wherein a read voltage of the input end signal generating device is less than or equal to a current set voltage value on the non-volatile memory cell, so as to ensure that the conductance value of the non-volatile memory cell is not changed during the convolution operation.

6. The convolution operation accelerator according to claim 1, wherein the convolution operation accelerator is configured to achieve the convolution operation in a convolution neural network.

7. The convolution operation accelerator according to claim 6, wherein during a training process of the convolutional neural network, the control module is further configured to adjust the conductance value of each non-volatile memory cell by applying a write voltage on the corresponding word line electrode and bit line electrode to update a parameter of the convolutional neural network and re-uses the convolution operation result of a previous round of the convolution operation accelerator as input of a next round of convolution operation of the convolution operation accelerator.

8. The convolution operation accelerator according to claim 7, wherein when the conductance value of the non-volatile memory cell is required to be increased, an absolute value of a write voltage difference value applied to the corresponding word line electrode and the bit line electrode is the corresponding set voltage value, and when the conductance value of the non-volatile memory cell is required to be decreased, the absolute value of the write voltage difference value applied to the corresponding word line electrode and the bit line electrode is a corresponding reset voltage value.

9. A convolution operation method based on the convolution operation accelerator according to claim 1, comprising the following steps:

step S1, splitting the convolution kernel into k convolution kernel units with a size of 2×c by row when a size of the convolution kernel being subjected to a convolution operation with the two-dimensional input data is 2k×c, where k is a positive integer; selecting and arranging k different sub-array units with a size of (M−2(k−1))×N in a word line electrode array to correspond to the k convolution kernel units with the size of 2×c one to one according to a splitting sequence of the convolution kernel; storing each convolution kernel unit and N−c copies thereof in two layers of non-volatile memory cell arrays between all adjacent two word line electrode layers in a corresponding sub-array unit; and applying data from a 2i−1$^{th}$ row to a M−2(k−i)$^{th}$ row of the two-dimensional input data to a corresponding word line electrode in an i$^{th}$ sub-array unit in the form of voltage according to corresponding coordinate information, where i=1, 2, L, . . . , k;

splitting the convolution kernel into k convolution kernel units with a size of 2×c and one convolution kernel unit with a size of 1×c by row when the size of the convolution kernel being subjected to the convolution operation with the two-dimensional input data is (2k+1)×c; selecting k sub-array units with the size of (M−2(k−1)−1)×N and one sub-array unit with the size of (M−2k)×N in the word line electrode array; arranging the k sub-array units with the size of (M−2(k−1)−1)×N to correspond to the k convolution kernel units with the size of 2×c one to one according to the splitting sequence of the convolution kernel; storing each convolution kernel unit with the size of 2×c and N−c copies thereof in the two layers of the non-volatile memory cell arrays between all adjacent two word line electrode layers in the corresponding sub-array unit, for each word line electrode layer in the sub-array unit with the size of (M−2k)×N, storing the convolution kernel unit with the size of 1×c and the N−c copies of the convolution kernel unit with the size of 1×c in one of the non-volatile memory cell arrays connected to it and setting all the non-volatile memory cells in the non-volatile memory cell array not storing the convolution kernel unit to a high-impedance state, applying the data from the 2i−1$^{th}$ row to the M−2(k−i)−1$^{th}$ row on the two-dimensional input data to the corresponding word line electrode in the i$^{th}$ sub-array unit with the size of (M−2(k−1)−1)×N in the form of voltage according to the corresponding coordinate information, where i=1, 2, L, . . . , k; and applying the data from the 2k+1$^{th}$ row to the M$^{th}$ row on the two-dimensional input data to the corresponding word line electrode in the sub-array unit with the size of (M−2k)×N in the form of voltage according to the corresponding coordinate information;

step S2: achieving in parallel a dot product operation between the convolution kernel units and the different parts of the two-dimensional input data based on the non-volatile memory cell array and outputting in parallel a sum of dot product operation results of the convolution kernel units and the corresponding parts of the two-dimensional input data via the corresponding bit line electrode layer, so as to achieve the convolution operation between the convolution kernel and the two-dimensional input data, wherein a size of two-dimensional input data is denoted as M×N, after being sequentially stored on a corresponding oblique line of the corresponding non-volatile memory cell array, each row of convolution kernel data of the convolution kernel units moves horizontally in a sliding direction of the convolution kernel onto the adjacent N−c oblique lines, the row of convolution kernel data is stored again, each layer of the non-volatile memory cell array stores the convolution kernel data of the corresponding row in the convolution kernel unit, and N−c copies of the convolution kernel data are implemented.

10. The convolution operation method according to claim 9, wherein when the size of the convolution kernel is 2k×c, the step S2 comprises: based on the two layers of the non-volatile memory cell arrays between all adjacent two word line electrode layers in the sub-array unit with the size of (M−2(k−1))×N and after achieving in parallel the dot product operation between the convolution kernel units with the size of 2×c and the different parts of the two-dimensional input data, outputting in parallel the sum of the dot product operation results of the convolution kernel units with the size of 2×c and the corresponding parts of the two-dimensional input data through the corresponding bit line electrode layer; and summarizing outputs of bit lines at a same relative position in each selected sub-array unit and obtaining a convolution operation result of the convolution kernel and the two-dimensional input data;

when the size of the convolution kernel is $(2k+1)\times c$, the step S2 comprises: based on the two layers of the non-volatile memory cell arrays between all adjacent two word line electrode layers in the sub-array unit with the size of $(M-2(k-1)-1)\times N$ and after achieving in parallel the dot product operation between the convolution kernel units with the size of $2\times c$ and the different parts of the two-dimensional input data, outputting in parallel the sum of the dot product operation results of the convolution kernel units with the size of $2\times c$ and the corresponding parts of the two-dimensional input data through the corresponding bit line electrode layer; based on the non-volatile memory cell array in the sub-array unit with the size of $(M-2k)\times N$ and after achieving in parallel the dot product operation between the convolution kernel unit with the size of $1\times c$ and the different parts of the two-dimensional input data, outputting in parallel the sum of the dot product operation results of the convolution kernel unit with the size of $1\times c$ and the corresponding parts of the two-dimensional input data through the corresponding bit line electrode layer; and summarizing the outputs of the bit lines in each selected sub-array unit and obtaining the convolution operation result of the convolution kernel and the two-dimensional input data.

\* \* \* \* \*